(12) United States Patent
Piila et al.

(10) Patent No.: US 11,563,430 B2
(45) Date of Patent: Jan. 24, 2023

(54) TRANSISTOR DIAGNOSTIC CIRCUIT

(71) Applicant: Texas Instruments Incorporated, Dallas, TX (US)

(72) Inventors: Antti Veli Johannes Piila, Kiviniemi (FI); Tuomas Tapani Tuikkanen, Oulu (FI); Mikko Topi Loikkanen, Oulu (FI); Jacobus Adrianus van Oevelen, Niederaichbach (DE); Juha Tapani Pennanen, Oulu (FI)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/488,760

(22) Filed: Sep. 29, 2021

(65) Prior Publication Data
US 2022/0140825 A1 May 5, 2022

Related U.S. Application Data

(60) Provisional application No. 63/107,605, filed on Oct. 30, 2020.

(51) Int. Cl.
*H03K 17/00* (2006.01)
*H03K 17/082* (2006.01)
*B60R 16/03* (2006.01)
*H03K 19/003* (2006.01)
*H03K 17/16* (2006.01)

(52) U.S. Cl.
CPC ..... *H03K 17/0822* (2013.01); *B60R 16/0315* (2013.01); *H03K 17/005* (2013.01); *H03K 17/161* (2013.01); *H03K 19/00315* (2013.01)

(58) Field of Classification Search
None
See application file for complete search history.

(56) References Cited

U.S. PATENT DOCUMENTS

| | | | | |
|---|---|---|---|---|
| 10,393,795 | B2 * | 8/2019 | Aeloiza | H01L 29/7805 |
| 2007/0223164 | A1 * | 9/2007 | Oki | H03K 17/0822 361/94 |
| 2009/0315585 | A1 * | 12/2009 | Ball | G01R 31/275 324/762.09 |
| 2011/0193580 | A1 * | 8/2011 | League | G01R 31/40 324/762.09 |
| 2014/0077782 | A1 * | 3/2014 | Cortigiani | H03K 17/0822 323/284 |
| 2014/0328087 | A1 * | 11/2014 | Tang | H02M 3/156 363/21.01 |
| 2019/0013784 | A1 * | 1/2019 | Li | H03F 1/0205 |
| 2020/0119540 | A1 * | 4/2020 | Buhari | H02H 9/004 |
| 2020/0192610 | A1 * | 6/2020 | Ajioka | H04N 1/00708 |
| 2020/0343715 | A1 * | 10/2020 | Kaeriyama | G01R 31/40 |
| 2020/0366189 | A1 * | 11/2020 | Yamanaka | H02M 1/32 |

* cited by examiner

*Primary Examiner* — Tuan T Lam
(74) *Attorney, Agent, or Firm* — Ray A. King; Frank D. Cimino

(57) ABSTRACT

A transistor diagnostic circuit includes a protection transistor output terminal, a fault terminal, and circuitry coupled to the protection transistor output terminal and the fault terminal. The protection transistor output terminal is adapted to be coupled to a current terminal of a protection transistor. The transistor diagnostic circuit is configured to, at start-up, load the protection transistor output terminal to test the protection transistor, and to generate a fault signal at the fault terminal responsive to a voltage on the protection transistor output terminal exceeding a threshold.

20 Claims, 7 Drawing Sheets

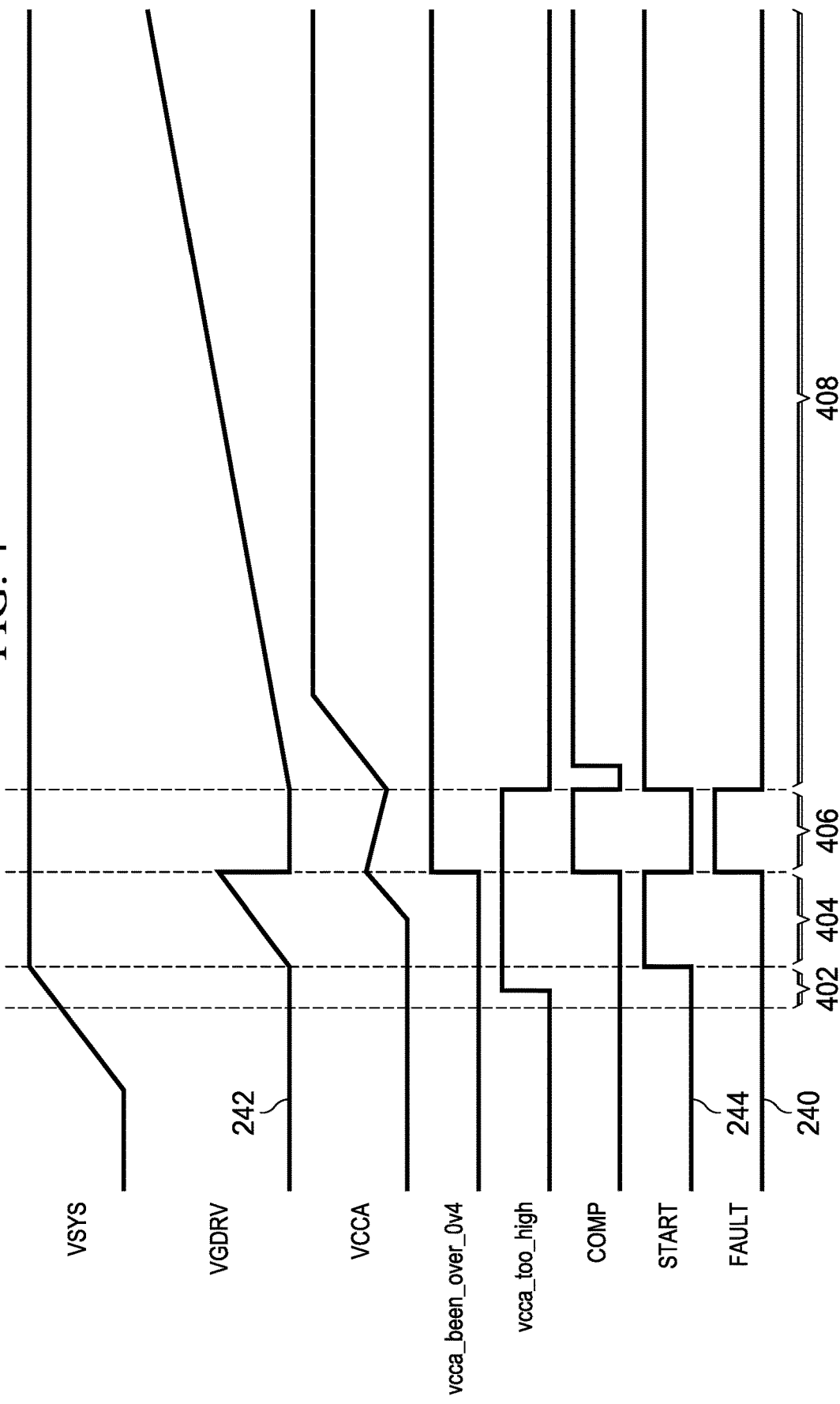

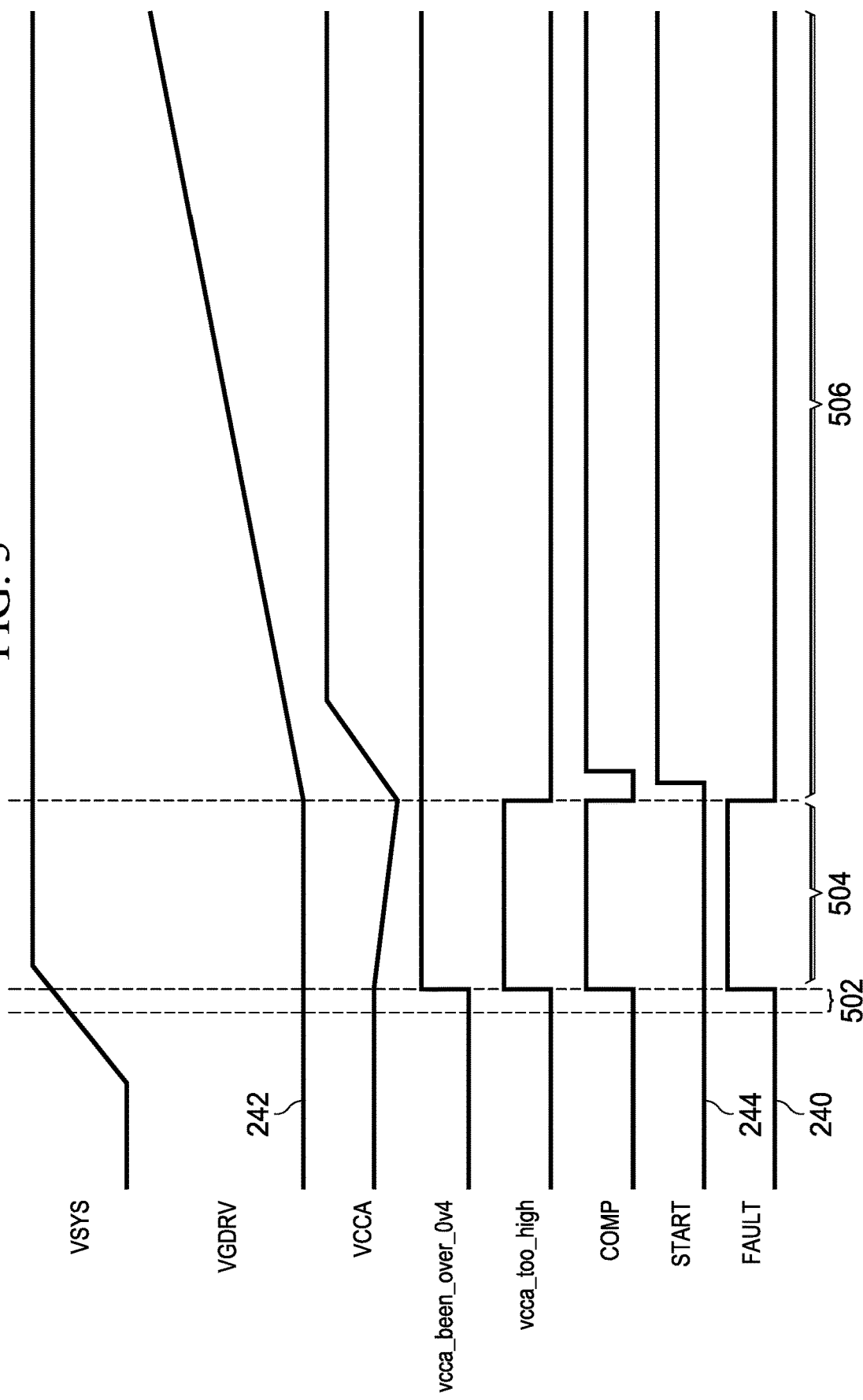

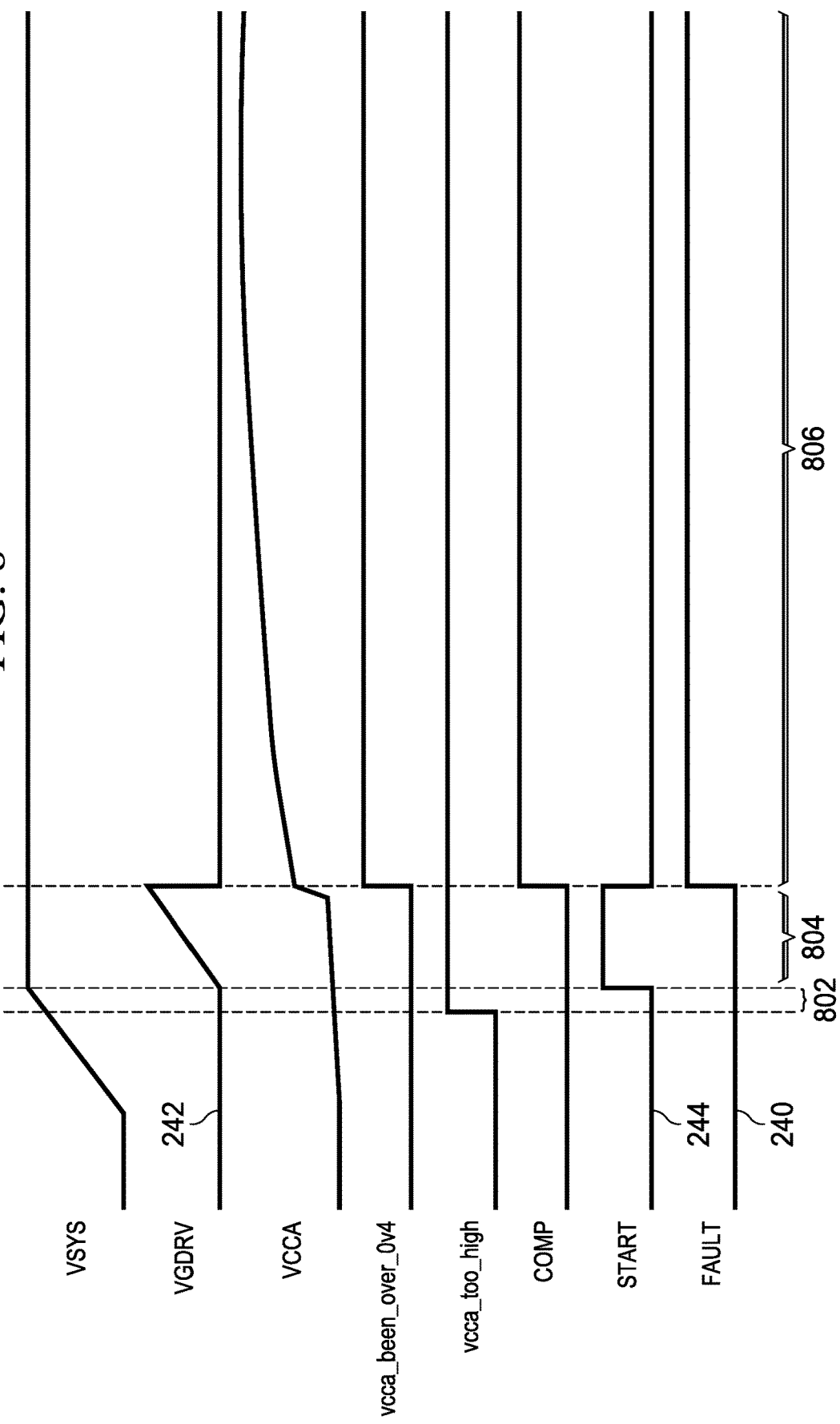

TRANSISTOR DIAGNOSTIC CIRCUIT

CROSS-REFERENCE TO RELATED APPLICATIONS

This application claims priority to U.S. Provisional Application No. 63/107,605, filed Oct. 30, 2020, entitled "MOSFET Fail-Short Diagnostic Circuit," which is hereby incorporated by reference in its entirety.

BACKGROUND

In electronic systems, including automotive and industrial systems, field effect transistors (FETs) are frequently used to switch power to a load circuit. A gate driver circuit may be used to turn the FET on and off. To protect the load circuit from latent failure of the FET in case of over-voltage, the gate driver circuit may include diagnostic circuitry.

SUMMARY

In one example, a transistor diagnostic circuit includes a protection transistor output terminal, a fault terminal, a load transistor, a comparator, a multiplexer, and a flip-flop. The load transistor includes a current terminal and a control terminal. The current terminal is coupled to the protection transistor output terminal. The control terminal is coupled to the fault terminal. The comparator includes a first input, a second input, and an output. The first input is coupled to the protection transistor output terminal. The multiplexer includes an output and a control input. The output is coupled to the second input of the comparator. The control input is coupled to the output of the comparator. The flip-flop includes an input and an output. The input of the flip-flop is coupled to the output of the comparator. The output of the flip-flop is coupled to the fault terminal.

In another example, a transistor diagnostic circuit includes a protection transistor output terminal, a fault terminal, and circuitry coupled to the protection transistor output terminal and the fault terminal. The protection transistor output terminal is adapted to be coupled to a current terminal of a protection transistor. The transistor diagnostic circuit is configured to, at startup of the transistor diagnostic circuit: load the protection transistor output terminal to test the protection transistor, and generate a fault signal at the fault terminal responsive to a voltage on the protection transistor output terminal exceeding a threshold.

In a further example, an automotive power control circuit includes load circuit, a protection transistor, and a driver. The protection transistor includes a current terminal and a control terminal. The current terminal is coupled to the load circuit. The driver is coupled to the protection transistor. The driver including a transistor diagnostic circuit. The transistor diagnostic circuit includes a protection transistor output terminal and, a fault terminal. The protection transistor output terminal is coupled to the current terminal of the protection transistor. The transistor diagnostic circuit is configured to, at start-up of the transistor diagnostic circuit: load the protection transistor output terminal to test the protection transistor, and generate a fault signal at the fault terminal responsive to a voltage on the protection transistor output terminal exceeding a threshold.

BRIEF DESCRIPTION OF THE DRAWINGS

FIG. 3 is a state diagram of for example operation of the gate driver of FIG. 2.

FIG. 4 is a timing diagram showing start-up of an example system that includes protection transistor testing.

FIG. 5 is a timing diagram showing start-up of an example system that includes protection transistor testing with residual voltage present in the system.

FIGS. 7 and 8 are timing diagrams showing start-up of an example system that includes protection transistor testing with a weak short present across the protection transistor.

DETAILED DESCRIPTION

When transistors (e.g., field effect transistors (FETs)) are used to switch power to a load circuit, diagnostic circuitry may be employed to ensure proper operation of the transistor and protection of the load circuit. For example, diagnostic circuitry may be provided to identify a short across a protection transistor. Some diagnostic circuits attempt to detect protection transistor shorts during normal operation (e.g., while powering the load circuit). However, the accuracy of short detection during normal operation may be relatively poor. Because a short across a protection transistor is a latent fault, rather the attempting to detect the short during normal operation, embodiments of the diagnostic circuit described herein detect the fault at start-up with before the load circuit is powered. Embodiments of the diagnostic circuit switch a load onto the output terminal of the protection transistor during start-up and detect a drop in voltage due to the load to determine whether the protection transistor is shorted.

Figure 1:
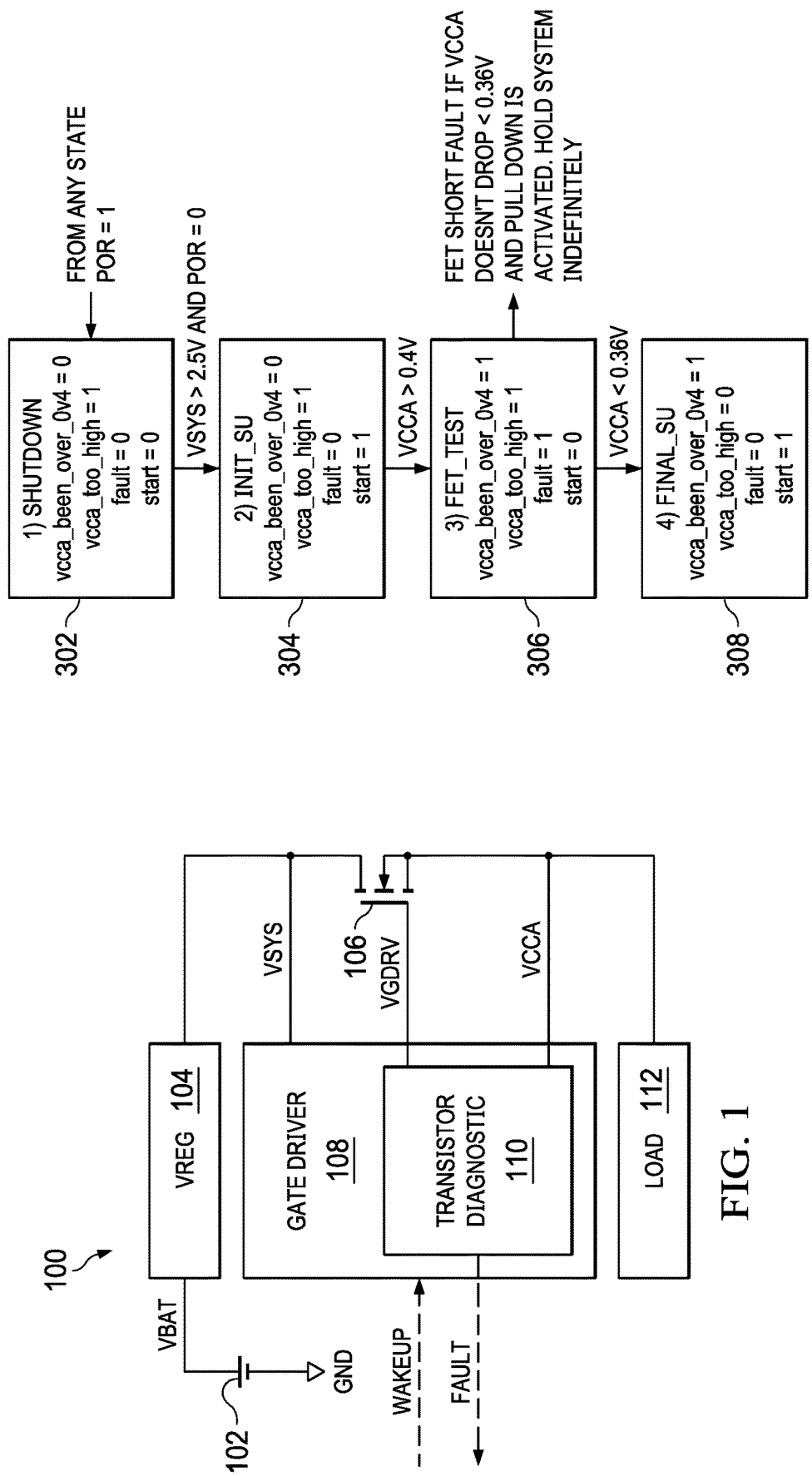
FIG. 1 is a block diagram for an example system that includes a protection transistor gate driver with diagnostics as described herein.

FIG. 1 is a block diagram for an example system 100 that includes a protection transistor gate driver with diagnostics as described herein. The system 100 may be an automotive power control circuit, an industrial power control circuit, or other power control circuit. The system 100 includes a voltage source 102, a voltage regulator 104, a protection transistor 106, a gate driver 108, and a load circuit 112. The voltage source 102 may be a battery. The voltage regulator 104 may be linear voltage regulator (e.g., a low-dropout linear voltage regulator) or a switching regulator. A current terminal (e.g., a drain terminal) of the protection transistor 106 is coupled to the voltage regulator 104. The protection transistor 106 switches voltage VSYS generated by the voltage regulator 104 to the load circuit 112. A current terminal (a source terminal) of the protection transistor 106 is coupled to the load circuit 112. The protection transistor 106 may be N-channel metal oxide semiconductor field effect transistor (MOSFET) or other FET (e.g., a P-channel MOSFET) in various implementations of the system 100.

The gate driver 108 is coupled to the protection transistor 106. The gate driver 108 controls the protection transistor 106 to enable/disable transfer of power from the voltage regulator 104 to the load circuit 112. A control terminal (e.g., a gate terminal) of the protection transistor 106 is coupled to the gate driver 108 for activating/deactivating the protection transistor 106 and controlling the transfer of power from the voltage regulator 104 to the load circuit 112. The gate driver 108 includes a transistor diagnostic circuit 110 that tests the protection transistor 106 to identify a short or other fault in the protection transistor 106. The transistor diagnostic circuit 110 tests the protection transistor 106 at initialization of the system 100 (at startup of the system 100) to identify faults before the system 100 is operational. The transistor diagnostic circuit 110 activates a fault signal responsive to identification of a short in the protection transistor 106 or other fault.

Figure 2:
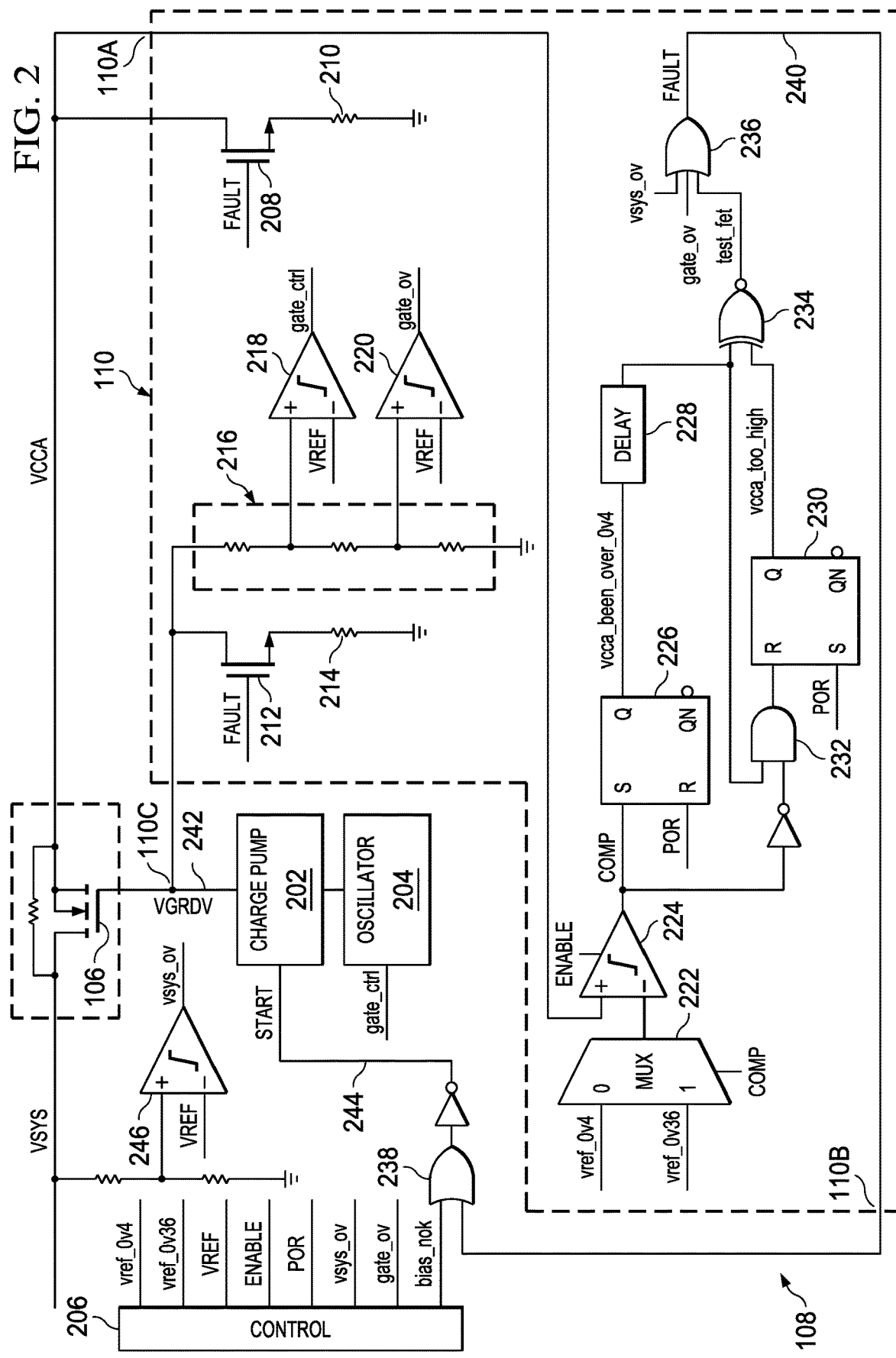
FIG. 2 is a block diagram for an example gate driver that includes protection transistor diagnostics as described herein.

FIG. 2 is a block diagram for an example of the gate driver 108. The gate driver 108 includes a charge pump 202, an oscillator 204, a control circuit 206, and the transistor diagnostic circuit 110. The protection transistor 106 is illustrated in FIG. 2 for reference. The charge pump 202 is coupled to the control terminal of the protection transistor 106, and generates a control voltage 242 that is a multiple (twice, three times, etc.) of VSYS for activating the protection transistor 106. The oscillator 204 is coupled to the charge pump 202, and generates a clock signal that is used by the charge pump 202 to generate the control voltage 242 provided to the protection transistor 106. The control circuit 206 is coupled to the charge pump 202 and the transistor diagnostic circuit 110 and provides various control signals used by the charge pump 202 and the transistor diagnostic circuit 110.

The transistor diagnostic circuit 110 includes a load transistor 208, a load transistor 212, a voltage divider 216, a comparator 218, a comparator 220, a multiplexer 222, a comparator 224, a flip-flop 226, a delay circuit 228, a flip-flop 230, a logic gate 232, a logic gate 234, and a logic gate 236. The transistor diagnostic circuit 110 tests the protection transistor 106 at start-up by turning on the protection transistor 106 until the voltage (VCCA) provided to the protection transistor output terminal 110A exceeds a first threshold voltage. The protection transistor output terminal 110A is coupled to the current terminal (source) of the protection transistor 106. When VCCA exceeds the first threshold, the transistor diagnostic circuit 110 turns off the protection transistor 106 and activates the load transistor 208 to pull down VCCA. If the load transistor 208 pulls VCCA below a second threshold, then the protection transistor 106 is deemed not faulty. If the load transistor 208 does not pull VCCA below the second threshold, then the protection transistor 106 is deemed faulty (e.g., shorted).

The load transistor 208 includes a current terminal (drain) coupled to the protection transistor output terminal 110A, a current terminal (source) coupled to ground via a resistor 210, and control terminal (gate) coupled to the fault terminal 1106. The load transistor 208 loads (sinks current from) VCCA when the fault signal 240 is active. The load transistor 212 includes a current terminal (drain) coupled to a protection transistor control terminal 110C, a current terminal (source) coupled to ground via a resistor 214, and a control terminal (gate) coupled to the fault terminal 1106. The load transistor 212 loads the control voltage 242 provided to the protection transistor 106 when the fault signal 240 is active.

The voltage divider 216 is coupled to the protection transistor control terminal 110C. The comparator 218 and the comparator 220 are coupled to the voltage divider 216. The comparator 218 and the comparator 220 compare a reference voltage (VREF) to a fraction of the control voltage 242 produced by the voltage divider 216. The comparator 218 compares VREF to a first fraction of the control voltage 242 (provided at a first divider node), and the comparator 220 compares VREF to a second fraction of the control voltage 242 (provided at a second divider node). The output of the comparator 220 is coupled to the logic gate 236. If the second fraction of the control voltage 242 exceeds VREF, then the control voltage 242 is too high, and the fault signal 240 is activated.

The comparator 224 compares VCCA to a selectable threshold value. A first input of the comparator 224 is coupled to the protection transistor output terminal 110A, and a second input of the comparator 224 is coupled to the output of the multiplexer 222. A first input of the multiplexer 222 is coupled to the control circuit 206 for receipt of a first threshold voltage (e.g., 0.4 volts). A second input of the multiplexer 222 is coupled to the control circuit 206 for receipt of a second threshold voltage (e.g., 0.36 volts). The control circuit 206 includes a first threshold voltage source and a second threshold voltage source for generating the first threshold voltage and the second threshold voltage. For example, the control circuit 206 may include a reference voltage source and voltage dividers to generate the first and second threshold voltages. A control input of the multiplexer 222 is coupled to the output of the comparator 224 to control selection of the first and second threshold voltages. When the output signal (COMP) of the comparator 224 is low, the multiplexer 222 provides the first threshold voltage to the comparator 224, and when COMP is high, the multiplexer 222 provides the second threshold voltage to the comparator 224. At start-up of the gate driver 108, COMP is low. When VCCA exceeds the first threshold voltage, COMP goes high and the comparator 224 compares VCCA to the second threshold.

The output of the comparator 224 is coupled to a set input of the flip-flop 226. When VCCA exceeds the first threshold voltage, the flip-flop 226 is set to indicate that VCCA has exceeded the first threshold voltage. A reset input of the flip-flop 226 is coupled a power on reset (POR) output of the control circuit 206. The delay circuit 228 is coupled to the flip-flop 226 to delay the output of the flip-flop 226.

The reset input of the flip-flop 230 is coupled to the output of the comparator 224 via the logic gate 232. The set input of the flip-flop 230 coupled to the POR output of the control circuit 206. POR sets the flip-flop 230 at start-up of the gate driver 108. When the outputs of the flip-flop 226 and the flip-flop 230 are high, the output of the logic gate 234 and the output of the logic gate 236 (the fault signal 240) are high. The load transistor 208 and the load transistor 212 are turned on to load VCCA and the control voltage 242, and the charge pump 202 is turned off (via the logic gate 238), when the fault signal 240 is high. When VCCA falls below the second threshold voltage, COMP goes low and the flip-flop 230 is reset. When the output of the flip-flop 230 goes low, the fault signal 240 also goes low, indicating that the protection transistor 106 is not faulty (not shorted), and turning off the load transistor 208 and the load transistor 212. If VCCA does not fall below the second threshold, then COMP remains high and the output of the flip-flop 230 remains high indicating that the protection transistor 106 is faulty.

Some implementations of the gate driver 108 may include a comparator 246 that compares VSYS (or a fraction of VSYS) to a reference voltage. The fault signal 240 is activated if VSYS (or the fraction of VSYS) exceeds the reference voltage.

FIG. 3 is a state diagram illustrating operation of the gate driver 108. Block 302 represents a shutdown state that may be entered from any other state by activation of POR. In the shutdown state: 1) the flip-flop 226 is reset, setting the signal vcca_been_over_0v4 low; 2) the flip-flop 230 is set, setting the signal VCCA_TOO_HIGH low; 3) the fault signal 240 is low indicating no fault detected; and 4) the start signal 244 is low to disable the charge pump 202 and turn off the protection transistor 106.

As the voltage VSYS provided by the voltage source 102 rises and exceeds a threshold (e.g., 2.5 volts), and POR is deactivated, the gate driver 108 transitions to an initialization state shown in block 304. The POR threshold (e.g., 2.5 volts) and the first threshold (e.g., 0.4 volts) are selected to define a resistance value (of the resistor 210), which in the case of worst case VSYS overvoltage, VCCA will remain below a selected maximum voltage (e.g., a maximum voltage that can applied to the load circuit 112 without damage). The various parameter related to short detection in system 100 are related by, and values thereof may be selected using:

$$R_{Short} = \frac{V_{SYS\_POR} - V_{TRIP}}{\frac{V_{TRIP}}{R_{PD}}} = \frac{R_{PD}(V_{SYS\_POR} - V_{TRIP})}{V_{TRIP}} \quad (1)$$

where:
$R_{Short}$ is the short resistance of the transistor 106;
$V_{SYS\_POR}$ is the minimum voltage output by the voltage regulator 104 applied to execute diagnostics (e.g., 2.5 volts);
$V_{TRIP}$ is the first threshold voltage applied to the comparator 224 (e.g., 0.4 volts); and
$R_{PD}$ is the resistance of the resistor 210.

The maximum allowable value of VSYS for a maximum safe VCCA is calculated as:

$$V_{SYS\_MAX} = \frac{V_{CCA\_MAX}(R_{PD} - R_{Short})}{R_{PD}} \quad (2)$$

where:
$V_{SYS\_MAX}$ is the maximum allowable value of VSYS for a maximum safe VCCA; and
$V_{CCA\_MAX}$ is the maximum safe value of VCCA.

In the initialization state, the start signal 244 goes high to enable the charge pump 202. Enabling the charge pump 202 causes the control voltage 242 to rise and start to turn on the protection transistor 106, which causes VCCA to increase.

When VCCA exceeds the first threshold voltage (e.g., 0.4 volts), the gate driver 108 transitions to a transistor test state shown in the block 306. Because VCCA exceeds the first threshold: 1) vcca_been_over_0v4 is high; 2) the fault signal 240 is high, which disables the charge pump 202 (and turns off the protection transistor 106); and 3) the load transistor 208 is turned on to load VCCA. The gate driver 108 will remain in the transistor test state, with the fault signal 240 high, indicating that the protection transistor 106 may be shorted, for as long as VCCA exceeds the second threshold voltage (e.g., 0.36 volts).

If VCCA falls below the second threshold (e.g., if VCCA falls below 0.36 volts), then the gate driver 108 transitions to a final state shown in block 308. In the final state, the protection transistor 106 is deemed not shorted, the flip-flop 230 is reset (setting vcca_too_high low), the fault signal 240 is low, and the charge pump 202 is enabled to turn on the protection transistor 106 and provide power to the load circuit 112.

FIG. 4 is a timing diagram for start-up of the system 100 with a protection transistor 106 that is not shorted. In the interval 402, the gate driver 108 is operating in the shutdown state. The voltage VSYS is increasing, the flip-flop 226 is reset, the flip-flop 230 is set (setting vcca_too_high high), and the charge pump 202 is disabled. Signal states are as indicated in block 302 of FIG. 3.

In the interval 404, the gate driver 108 is operating in the initialization state. VSYS has increased to exceed a threshold voltage (e.g., 2.5 volts), and the charge pump 202 is enabled to turn on the protection transistor 106. The control voltage 242 increases to turn on the protection transistor 106, and VCCA increases. Signal states are as indicated in block 304 of FIG. 3.

In the interval 406, the gate driver 108 is operating in the transistor test state, and signal states are as indicated in block 306 of FIG. 3. VCCA exceeds the first threshold voltage (e.g., 0.4 volts), COMP goes high and the fault signal 240 goes high. The charge pump 202 is disabled and the load transistors 208 and 212 are turned on to load VCCA and pull down the control voltage 242. With the protection transistor 106 turned off, and the load transistor 208 loading VCCA, VCCA decreases. When VCCA falls below the second threshold voltage (e.g., 0.36 volts), COMP goes low and the fault signal 240 goes low to indicate that the protection transistor 106 is not shorted.

In the interval 408, the gate driver 108 is operating in the final state. When the fault signal 240 goes low, the charge pump 202 is enabled, and the control voltage 242 increases to turn on the protection transistor 106. Signal states are as indicated in block 308 of FIG. 3.

FIG. 5 is a timing diagram for start-up of system 100 when residual voltage is present on VCCA. When residual voltage is present on VCCA, the shutdown and initialization states are shortened, the time spent discharging VCCA is increased. In the interval 502, the gate driver 108 is operating in the shutdown state and the initialization state. The voltage VSYS is increasing, the flip-flop 226 is reset, the flip-flop 230 is set, and the charge pump 202 is disabled. When VSYS has increased to exceed a threshold voltage (e.g., 2.5 volts), and POR is deactivated, VCCA exceeds the first threshold due to the residual voltage.

In the interval 504 the gate driver 108 is operating in the transistor test state. Because VCCA exceeds the first threshold voltage (e.g., 0.4 volts), COMP goes high and the fault signal 240 goes high. The load transistor 208 is turned on to load VCCA. With the protection transistor 106 turned off, and the load transistor 208 loading VCCA, VCCA decreases. When VCCA falls below the second threshold voltage (e.g., 0.36 volts), COMP goes low and the fault signal 240 goes low to indicate that the protection transistor 106 is not shorted.

In the interval 506, the gate driver 108 is operating in the final state. When the fault signal 240 goes low, the charge pump 202 is enabled, and the control voltage 242 increases to turn on the protection transistor 106.

Figure 6:
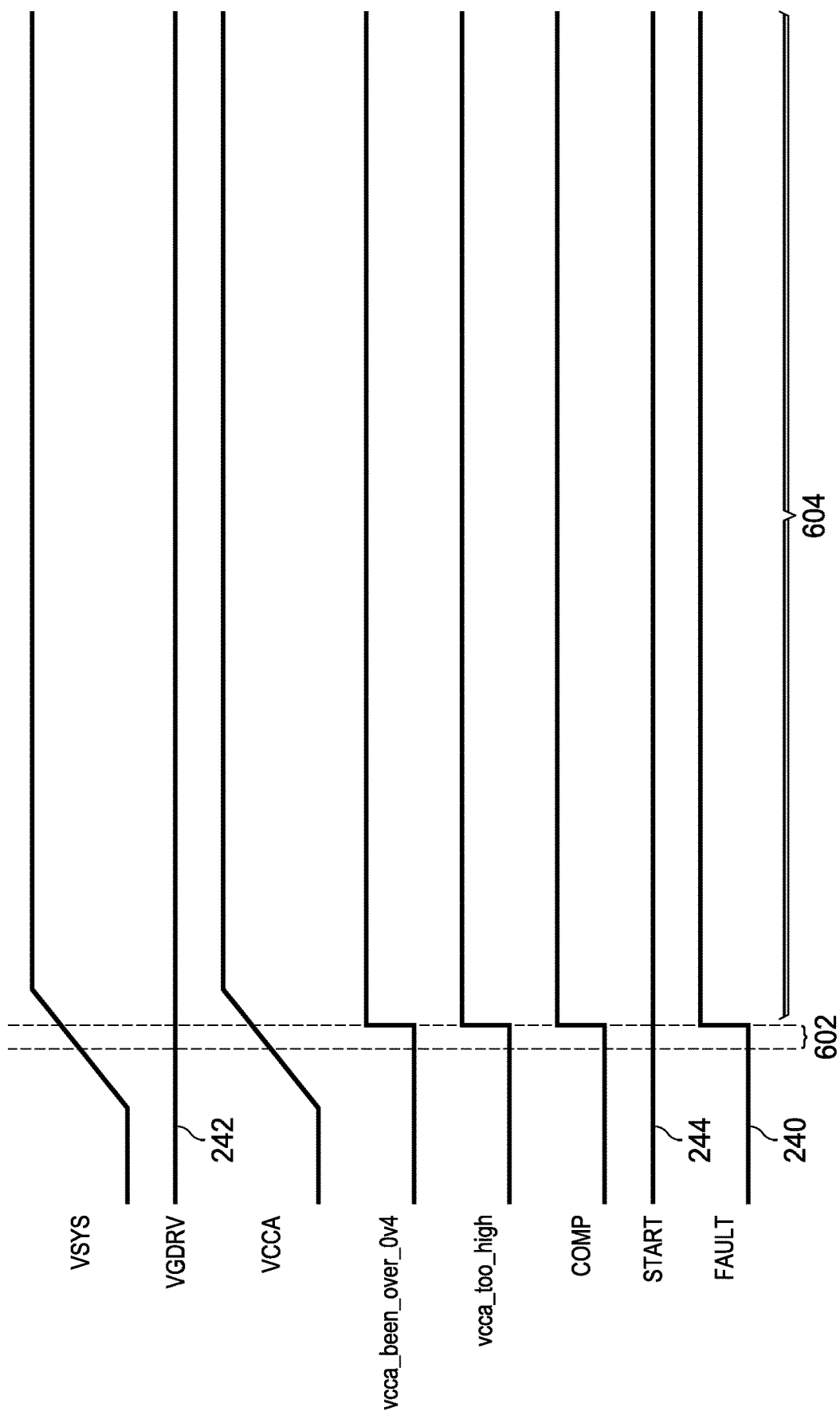
FIG. 6 is a timing diagram showing start-up of an example system that includes protection transistor testing with a hard short present across the protection transistor.

FIG. 6 is a timing diagram for start-up of the system 100 when a hard short is present across the protection transistor 106. A hard short may be a short of very low resistance (e.g., a milli-ohms). In the interval 602, the gate driver 108 is operating in the shutdown state and the initialization state. The voltage VSYS is increasing and VCCA increases with VSYS because of the short. The flip-flop 226 is reset, the flip-flop 230 is set, and the charge pump 202 is disabled. When VSYS has increased to exceed a threshold voltage (e.g., 2.5 volts), and POR is deactivated, VCCA exceeds the first threshold due to the short.

In the interval 604, the gate driver 108 is operating in the transistor test state. Because VCCA exceeds the first threshold voltage (e.g., 0.4 volts), COMP goes high and the fault signal 240 goes high. The load transistor 208 is turned on to load VCCA. With the protection transistor 106 turned off, and the load transistor 208 loading VCCA, VCCA does not decrease due to the short across the protection transistor 106. VCCA does not fall below the second threshold voltage, and the fault signal 240 remains high indefinitely to indicate that the protection transistor 106 is shorted.

Figure 7:
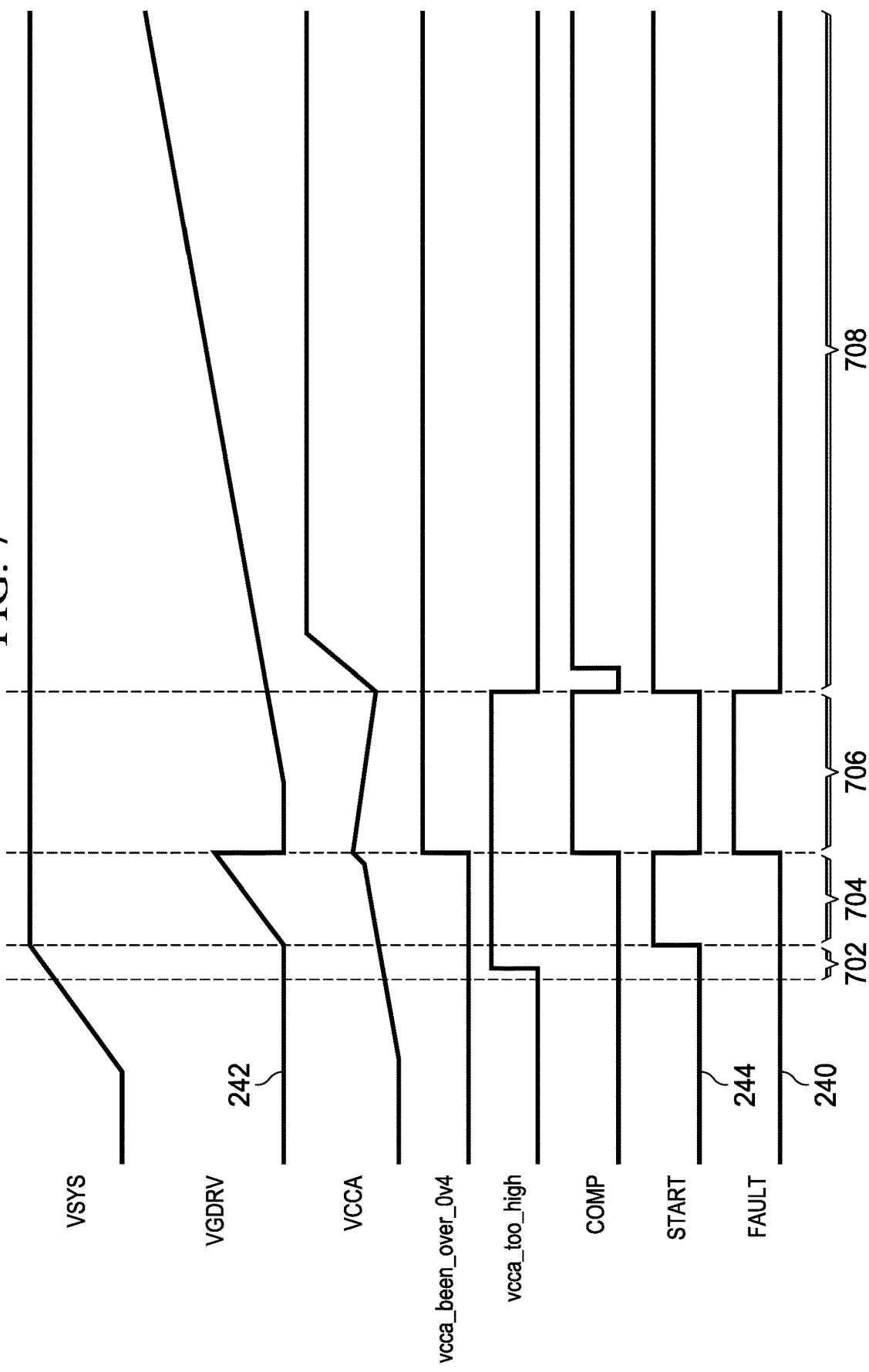

FIG. 7 is a timing diagram for start-up of the system 100 with a weak short across the protection transistor 106. A weak short may be short having a resistance of tens of ohms or more. In the example of FIG. 7, the current sunk by the load transistor 208 is greater than the current flowing through the weak short. In the interval 702, the gate driver 108 is operating in the shutdown state. The voltage VSYS is increasing, the flip-flop 226 is reset, the flip-flop 230 is set, and the charge pump 202 is disabled. Signal states are as indicated in block 302 of FIG. 3. Because of the weak short across the protection transistor 106, VCCA increases with VSYS.

In the interval 704, the gate driver 108 is operating in the initialization state. VSYS has increased to exceed a threshold voltage (e.g., 2.5 volts), and the charge pump 202 is enabled to turn on the protection transistor 106. The control voltage 242 increases to turn on the protection transistor 106, and VCCA increases. Signal states are as indicated in block 304 of FIG. 3.

In the interval 706, the gate driver 108 is operating in the transistor test state, and signal states are as indicated in block 306 of FIG. 3. VCCA exceeds the first threshold voltage (e.g., 0.4 volts), COMP goes high and the fault signal 240 goes high. The charge pump 202 is disabled, causing the control voltage 242 to decrease and turn off the protection transistor 106. The load transistor 208 is turned on to load VCCA. With the protection transistor 106 turned off, and the load transistor 208 sinking current from VCCA, VCCA decreases. The rate of VCCA decrease is slowed by the weak short across the protection transistor 106. When VCCA falls below the second threshold voltage (e.g., 0.36 volts), COMP goes low and the fault signal 240 goes low to indicate that the protection transistor 106 is not faulty.

In the interval 708, the gate driver 108 is operating in the final state. When the fault signal 240 goes low, the charge pump 202 is enabled, and the control voltage 242 increases to turn on the protection transistor 106. Signal states are as indicated in block 308 of FIG. 3.

FIG. 8 is a timing diagram for start-up of the system 100 with a weak short across the protection transistor 106. In the example of FIG. 8, the current sunk by the load transistor 208 is less than the current flowing through the weak short. In the interval 802, the gate driver 108 is operating in the shutdown state. The voltage VSYS is increasing, the flip-flop 226 is reset, the flip-flop 230 is set, and the charge pump 202 is disabled. Signal states are as indicated in block 302 of FIG. 3. Because of the weak short across the protection transistor 106, VCCA increases with VSYS.

In the interval 804, the gate driver 108 is operating in the initialization state. VSYS has increased to exceed a threshold voltage (e.g., 2.5 volts), and the charge pump 202 is enabled to turn on the protection transistor 106. The control voltage 242 increases to turn on the protection transistor 106, and VCCA increases. Signal states are as indicated in block 304 of FIG. 3.

In the interval 806, the gate driver 108 is operating in the transistor test state, and signal states are as indicated in block 306 of FIG. 3. VCCA exceeds the first threshold voltage (e.g., 0.4 volts), COMP goes high and the fault signal 240 goes high. The charge pump 202 is disabled and the load transistors 208 and 212 are turned on to load VCCA and pull down the control voltage 242. With the protection transistor 106 turned off, and the load transistor 208 sinking current from VCCA, VCCA continues to increase (or does not decrease) because of the weak short. VCCA doesn't fall below the second threshold voltage. The fault signal 240 remains high indefinitely to indicate that the protection transistor 106 is faulty.

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not substantially alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A transistor diagnostic circuit, comprising:
   a transistor having a current terminal coupled to a protection transistor output terminal, and a first control terminal coupled to a fault terminal;
   a comparator having first and second comparator inputs and a comparator output, the first comparator input coupled to the protection transistor output terminal;
   a multiplexer having first and second multiplexer inputs and a multiplexer output, the multiplexer output being coupled to the second comparator input; and
   a flip-flop having a first flip-flop input and a flip-flop output, wherein the first flip-flop input is coupled to the comparator output, and the flip-flop output is coupled to the fault terminal.

2. The transistor diagnostic circuit of claim 1, wherein the transistor diagnostic circuit includes:
   a first threshold voltage source coupled to the first multiplexer input; and
   a second threshold voltage source coupled to the second multiplexer input.

3. The transistor diagnostic circuit of claim 1, wherein the transistor diagnostic circuit includes:
   a second flip-flop having a second flip-flop input and a second flip-flop output, the second flip-flop input coupled to the comparator output;
   a delay circuit having a delay input and a delay output, the delay input coupled to the second flip-flop output; and
   a logic gate having a first logic input, a second logic input, and a first logic output, wherein the first logic input is coupled to the delay output, the second logic input is coupled to the comparator output, and the first logic output is coupled to the first flip-flop input.

4. The transistor diagnostic circuit of claim 3, wherein the logic gate is a first logic gate, and the transistor diagnostic circuit includes:
   a second logic gate having a third logic input, a fourth logic input, and a second logic output, the third logic input coupled to the delay output, the fourth logic input coupled to the first flip-flop output, and the second logic output coupled to the fault terminal.

5. The transistor diagnostic circuit of claim 1, wherein the transistor is a first transistor, and the transistor diagnostic circuit includes a second transistor having a second current terminal and a second control terminal, the second current terminal coupled to the first control terminal, and the second control terminal is coupled to the fault terminal.

6. The transistor diagnostic circuit of claim 5, wherein the comparator is a first comparator, and the transistor diagnostic circuit includes:
   a voltage divider coupled between the first control terminal and a ground terminal, wherein the voltage divider includes a first divider terminal and a second divider terminal;
   a voltage reference source; and
   a second comparator having third and fourth comparator inputs and a second comparator output, the third comparator input coupled to the first divider terminal, and the fourth comparator input coupled to the reference voltage source, and the second comparator output coupled to the fault terminal.

7. The transistor diagnostic circuit of claim 6, further comprising:
   a third comparator having fifth and sixth comparator inputs and a third comparator output, the fifth comparator input coupled to the second divider terminal, the sixth comparator input coupled to the reference voltage source, and the third comparator output coupled to the fault terminal.

8. A transistor diagnostic circuit, comprising:
   a comparator having first and second comparator inputs and a comparator output, the first comparator input configured to be coupled to a transistor current terminal, and the second comparator input coupled to a reference voltage source;
   a first flip-flop having a first flip-flop input and a first flip-flop output, the first flip-flop input coupled to the comparator output;
   a second flip-flop having a second flip-flop input and a second flip-flop output, the second flip-flop input coupled to the comparator output; and
   a logic circuit having first and second logic inputs and a logic output, the first logic input coupled to the first flip-flop output, the second logic input coupled to the second flip-flop output, and the logic output coupled to a fault terminal;
   wherein the transistor diagnostic circuit is configured to:
      connect the transistor current terminal to a load transistor; and
      generate a fault signal at the fault terminal responsive to a voltage on the transistor current terminal exceeding a threshold voltage.

9. The transistor diagnostic circuit of claim 8, further comprising:
   a load transistor coupled between the transistor current terminal and a ground terminal;
   wherein the transistor diagnostic circuit is configured to activate the load transistor to test a protection transistor coupled to the transistor current terminal.

10. The transistor diagnostic circuit of claim 9, wherein the transistor diagnostic circuit is configured to
   activate the load transistor responsive to the voltage at the transistor current terminal exceeding the threshold voltage.

11. The transistor diagnostic circuit of claim 10, wherein:
   the threshold is a first threshold;
   the transistor diagnostic circuit is configured to:
      compare the voltage at the transistor current terminal to a second threshold responsive to the voltage at the transistor current terminal exceeding the first threshold, wherein the second threshold is lower than the first threshold.

12. The transistor diagnostic circuit of claim 11, wherein the transistor diagnostic circuit is configured to:
   activate a fault signal at the fault terminal responsive to the voltage at the transistor current terminal being greater than the first threshold; and
   deactivate the fault signal responsive to the voltage at the transistor current terminal being less than the second threshold.

13. The transistor diagnostic circuit of claim 8, further comprising a protection transistor control terminal adapted to be coupled to a control terminal of the protection transistor, wherein the transistor diagnostic circuit is configured to activate a fault signal at the fault terminal responsive to a voltage at the transistor current terminal exceeding a threshold voltage.

14. The transistor diagnostic circuit of claim 13, wherein the threshold voltage is a first threshold voltage, and
   wherein the transistor diagnostic circuit is configured to activate the load transistor responsive to a voltage at the protection transistor control terminal exceeding a second threshold voltage.

15. An automotive power control circuit, comprising:
   a load transistor coupled between a protection terminal and a ground terminal;
   a protection transistor having a current terminal coupled to the protection terminal, and a control terminal coupled to a fault terminal;
   a comparator having first and second comparator inputs and a comparator output, the first comparator input coupled to the protection terminal;
   a multiplexer having first and second multiplexer inputs and a multiplexer output, the multiplexer output being coupled to the second comparator input; and
   a flip-flop having a first flip-flop input and a first flip-flop output, wherein the first flip-flop input is coupled to the comparator output, and the first flip-flop output is coupled to the fault terminal;
   wherein the automotive power control circuit is configured to generate a fault signal at the fault terminal responsive to a voltage on the protection terminal exceeding a threshold.

16. The automotive power control circuit of claim 15, wherein the automotive power control circuit
   is configured to activate the load transistor to test the protection transistor.

17. The automotive power control circuit of claim 16, wherein the
   comparator is configured to compare a voltage at the protection terminal to a first threshold voltage and a second threshold voltage,
   wherein the first threshold voltage is higher than the second threshold voltage.

18. The automotive power control circuit of claim 17, wherein the automotive power control circuit is configured to:
   activate the load transistor responsive to the voltage at the protection terminal exceeding the first threshold voltage; and
   deactivate the load transistor responsive to the voltage at the protection terminal being less than the second threshold voltage.

19. The automotive power control circuit of claim 17, wherein the automotive power control circuit is configured to:

deactivate a fault signal at the fault terminal responsive to the voltage at the protection terminal being less than the second threshold voltage; and activate the fault signal at the fault terminal responsive to the voltage at the protection terminal exceeding the second threshold voltage.

20. The automotive power control circuit of claim 15, wherein the automotive power control circuit is configured to activate a fault signal at the fault terminal responsive to the voltage at the control terminal of the protection transistor exceeding the threshold.

* * * * *